United States Patent [19]
Markle

[11] 3,951,546
[45] Apr. 20, 1976

[54] THREE-FOLD MIRROR ASSEMBLY FOR A SCANNING PROJECTION SYSTEM

[75] Inventor: David A. Markle, Norwalk, Conn.

[73] Assignee: The Perkin-Elmer Corporation, Norwalk, Conn.

[22] Filed: Sept. 26, 1974

[21] Appl. No.: 509,598

[52] U.S. Cl. .................................. 355/51; 350/55; 350/199; 350/294; 355/60; 355/65
[51] Int. Cl.² .................. G03B 27/48; G03B 27/50; G03B 27/70
[58] Field of Search ................. 355/133, 49, 51, 52, 355/65, 66, 60; 350/55, 199, 294

[56] References Cited
UNITED STATES PATENTS

| | | | |
|---|---|---|---|
| 3,216,316 | 11/1965 | Brownscombe | 355/60 |
| 3,748,015 | 7/1973 | Offner | 350/199 X |
| 3,836,249 | 9/1974 | Weber | 355/51 |

Primary Examiner—Richard A. Wintercorn
Attorney, Agent, or Firm—Sal A. Giarratana; Francis L. Masselle; John K. Conant

[57] ABSTRACT

A three-fold mirror array for a scanning projection system to permit placing the object and image of an annular reflective projection system in an orientation which facilitates scanning and yields an image symmetry identical to that obtained with contact printing in which three folding flats are combined with an annular field projection system. The three folding flats are incorporated in a monolithic assembly having a 90° groove on one side and a fold surface perpendicular to the other folding surfaces on the other side of the assembly thereby permitting a simple pivoting scanning mechanism to be used for scanning a field larger than the narrow annular field available in the projection system.

5 Claims, 4 Drawing Figures

3,951,546

THREE-FOLD MIRROR ASSEMBLY FOR A SCANNING PROJECTION SYSTEM

BACKGROUND OF THE INVENTION

This invention relates to optical systems in general and more particularly to a three mirror folding system useful in combination with an annular reflective projection system to facilitate scanning an image and an object.

In copending application of H. S. Hemstreet et al., Ser. No. 339,860, filed Mar. 9, 1973 and assigned to the same assignee as the present invention, an optical projection and scanning apparatus is disclosed. The apparatus disclosed therein is a photographic device useful to affect the exposure to photoresist-coated semiconductor wafers in the manufacture of integrated circuits. In its operation, an arcuate area of an exposure-control mask is illuminated and the projection system images the illuminated portion of the mask onto the wafer. Synchronous motion of both the mask and wafer with respect to the illuminated region permits the entire wafer surface and corresponding mask surface to pass through the illuminated region thus resulting in imagery over the entire wafer. The apparatus uses an annular projection system of the type disclosed in U.S. Pat. No. 3,748,015 issued July 24, 1973. With nothing further, the employment of this projection system for the desired purpose would require movement of the image receiving surface, i.e., the wafer, across the imaged area in a direction opposite to the direction of relative movement of the projection mask or the like. Clearly, such is not desirable.

Thus it can be seen that, for this purpose, a simple projection apparatus enabling simultaneous movement of both the mask and wafer in a single direction is needed. In addition, it is desirable in such apparatus that the image projected be of the same orientation or symmetry as obtained in contact printing.

SUMMARY OF THE INVENTION

The present invention solves these problems through the use of a three mirror folding system which is combined with the annular projection optics of the aforementioned U.S. Pat. No. 3,748,015 to obtain a system having an orientation facilitating scanning and yielding an image symmetry identical to that obtained in contact printing.

Essentially, this is accomplished by incorporating the three folding flats into a single monolithic assembly having a 90° groove on one side and a fold surface perpendicular to the other folding surfaces on the other side of the assembly. This arrangement thus permits ease of combination with the annular field projection system and permits use of a pivoting scanning mechanism which moves the mask and wafer simultaneously.

DETAILED DESCRIPTION OF THE PREFERRED EMBODIMENT

Figure 1:
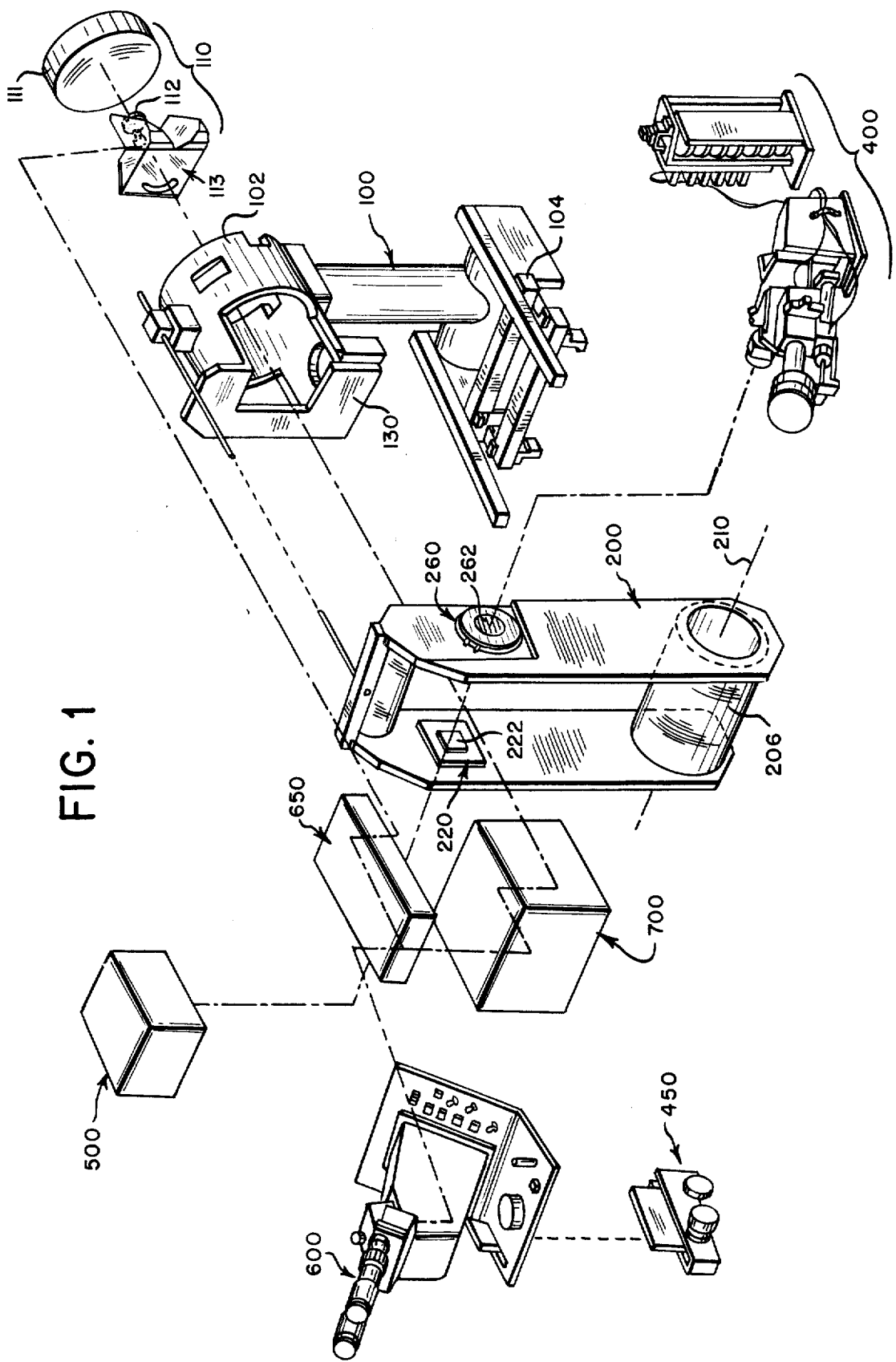
FIG. 1 is a perspective exploded view illustrating the three mirror folding system of the present invention in combination with an annular field projection system and a pivoting scanning mechanism.

FIG. 1 illustrates an exploded perspective view of an optical projection and scanning apparatus of the type disclosed and claimed in U.S. application Ser. No. 339,860. The machine includes a frame, not shown, in which the components seen in FIG. 1 are mounted, some fixedly and others movably. In particular, the machine includes a stationary pedestal 100 having a generally cylindrical head 102 inside which is mounted a unity magnification cotoptric image forming system 110. Catoptric systems suitable for use in the apparatus of the present invention are the subject of previously mentioned U.S. Pat. No. 3,748,015.

The machine in FIG. 1 further includes a carriage 200 pivotally mounted on the pedestal 100 for rotation with respect thereto. The carriage supports the mask and wafer for a scanning motion together with respect to the image-forming system 100 and an illumination system 500 by means of which exposure is effected. The system 110 forms on the wafer an image of the portion of the mask defined by an illumination slit which constitutes part of a stationary illumination system.

The carriage includes a mask stage 220 and a wafer stage 260 which are independently movable in finely controlled increments with respect to the carriage by means of mechanism illustrated in FIGS. 9 to 16 of the aforementioned application, Ser. No. 339,860.

The wafers (one shown at 262) are inserted in and removed from stage 260 by means of a handling mechanism 400, the details of which constitute no necessary part of the present invention. The masks are similarly insertable into and removable from mask stage 220 by mechanism of which a portion is diagrammatically indicated at 450 and the details of which again constitute no necessary part of the present invention.

The mask, one shown at 222, in stage 220 is illuminated by illumination system 500, details of one suitable form of which are shown in FIG. 5 of the aforementioned application Ser. No. 339,860. The illumination system also serves via optical system 110 to illuminate the wafer 262 in wafer stage 260, so as to permit correct positioning of the wafer with respect to the image of the mask projected onto it before the exposure is made. The actinically effective radiation for the exposure is in the ultraviolet spectrum and in the short wavelength portion of the visible spectrum, and the positioning is effected by means of visible light from which the actinic radiation has been removed.

To permit achievement of proper positioning of the mask and wafer in the carriage by means of their respective stages, the wafer and the image of the mask formed on the wafer by optical system 110, are examined by optics which include the optical system 110 itself, a binocular variable magnification microscope eyepiece 600, and certain additional elements, some of which are indicated diagrammatically in FIG. 1 at 650, and others at 700. Elements 650 and certain cooperating elements provide a relatively low magnification view of the mask and wafer while elements 700 permit a higher magnification view, as explained in the aforementioned application Ser. No. 339,860 with reference to FIGS. 3 and 4 thereof.

Mask 222 has a narrow arcuate, slit-shapped area 223 (FIG. 2) illuminated thereon through the use of an illumination system more fully disclosed in the aforementioned patent application Ser. No. 339,860 and also in a patent application of A. Offner and D. A. Markle entitled "Condenser for An Annular Field Optical System" filed on even date herewith and assigned to the same assignee as the present invention. Illuminated area 223 constitutes an extra-axial object for the image forming system 110 in accordance with the teaching of U.S. Pat. No. 3,748,015 above referred to, and for that extra-axial object the system 110 possesses optimum correction, again as disclosed in the aforementioned patent.

Illuminated area 223 of mask 222 defined by the illuminating system proper, is imaged on the surface of wafer 262 nearest it with the help of optical system 110. As disclosed in the aforementioned application Ser. No. 339,860, means also may be provided in the illumination system for broadly illuminating the mask as a whole. In that case, the whole mask will be imaged on the wafer in much the same manner as now to be described with particular reference to FIG. 2.

The components of this system are a primary concave mirror 111, a secondary convex mirror 112, and a mirror array 113. Mirrors 111 and 112 are advantageously constructed in accordance with the disclosure of the aforementioned U.S. Pat. No. 3,748,015. Accordingly, mirrors 111 and 112 are spherical, concentric, and secondary mirror 112 is advantageously given a radius of curvature slightly greater than one-half the radius of curvature of mirror 111, so as to achieve high quality imagery over an extra-axial zone which is caused to coincide with illuminated slit-shaped area 223. Array 113 may be made from three blocks of glass 120, 122 and 124, suitably shaped and assembled, and is provided with a reflecting face adjacent mask 222, the plane of which face is identified in FIG. 2 by the intersecting edges 114 and 115. This plane is inclined at 45° to the selected common axis of symmetry 118 of mirrors 111 and 112.

The reflecting face just mentioned desirably takes the form of a dichroic coating of high reflectivity in the ultraviolet spectrum and of approximately 50% reflection and 50% transmission in the visible spectrum. This coating is formed on a thin glass plate 701 affixed to the block 120, which is cut away as indicated at 724 for purposes pertaining to the fine viewing system described in conjunction with FIG. 4 of application Ser. No. 339,860.

By reflection at the face of plate 701, light from mask 222 is reflected onto the primary mirror 111, whence it is reflected to secondary mirror 112, back to primary mirror 111, and thence once more to array 113. To achieve on wafer 262 an image of the mask having the same orientation to the mask itself as that which characterized the orientation of a photographic print to the photographic negative from which the print is made in a contact print, three mirror array 113 of the present invention is provided with a pair of mutually perpendicular reflecting plane faces 116 and 117. Faces 116 and 117 constitute a "roof" in the terminology of prisms, and the line 167 of intersection of the roof surfaces is perpendicular to the plane face of plate 701 defined by the edges 114 and 115. This line of intersection is also inclined at 45° to axis 118. Faces 116 and 117 may be fully mirrored.

The combination of concave mirror 111 and convex mirror 112 provides a unity magnification optical system. For objects optically distant from mirror 111 substantially by length of the radius of curvature thereof, the optical distance from the mirror 111 to the image position is then likewise substantially equal to that radius of curvature. In accordance with the disclosure of U.S. Pat. No. 3,748,015, the combination of mirrors 111 and 112 is worked at unity magnification but off-axis, to permit separation of image and object, and also to achieve improved image quality within an annular extra-axial zone. Consequently, in currently preferred embodiments of the machine of the present invention, the object and image focal planes, occupied by mask 222 and wafer 262, are nominally, except in consequence of deviation of the optical path by reflections at array 113, in the plane through the common center of curvature of mirrors 111 and 112 which is perpendicular to axis 118. Array 113 is therefore spaced from mirrors 111 and 112 by distances less than their radii of curvature so as to throw the unity magnification conjugate planes of the combination out to opposite sides where mask 222 and wafer 262 may be located.

Figure 2:
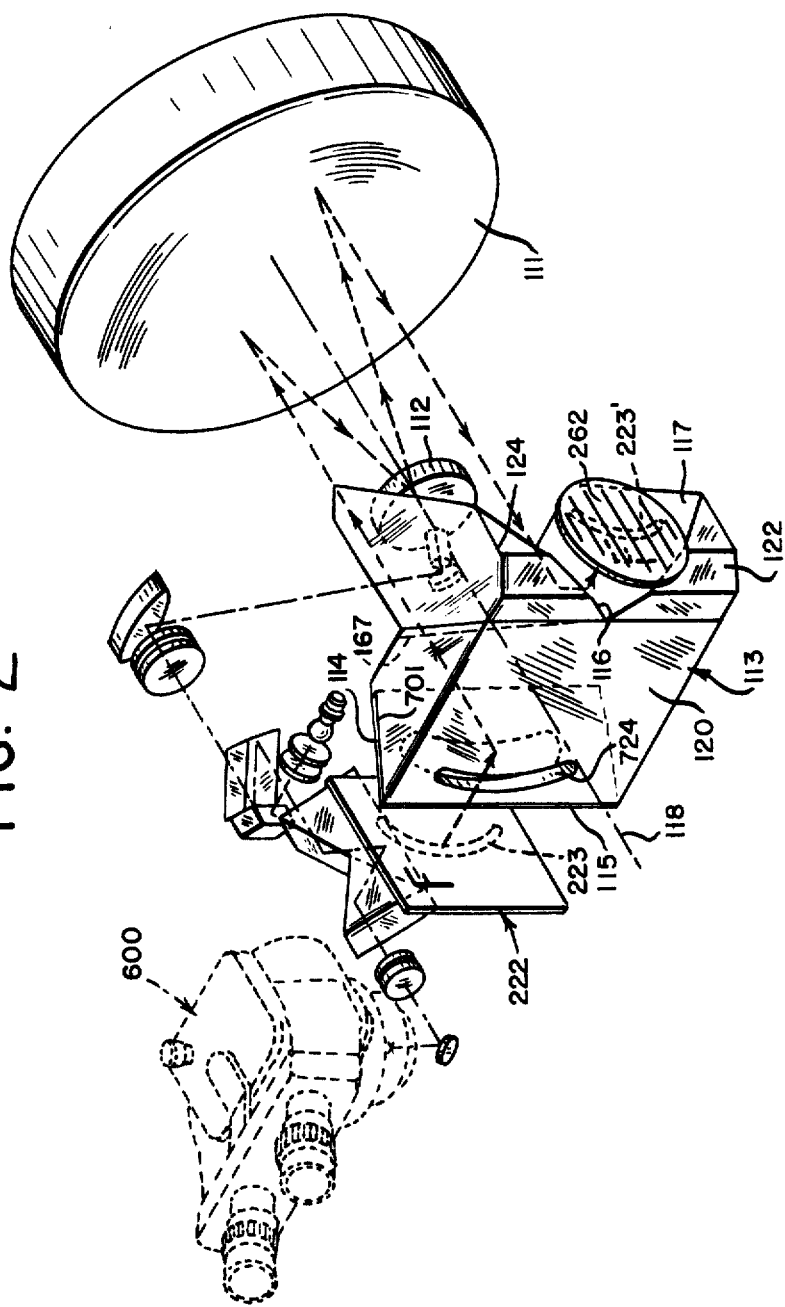
FIG. 2 is a perspective view illustrating the mirror array of the present invention.
Figure 3:
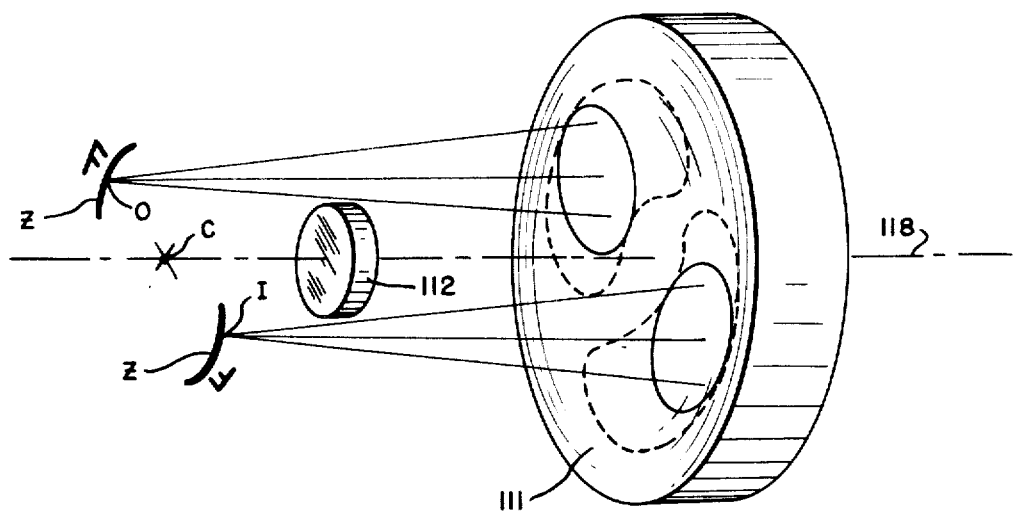
FIGS. 3 and 4 are optical schematics helpful in understanding the present invention.
Figure 4:
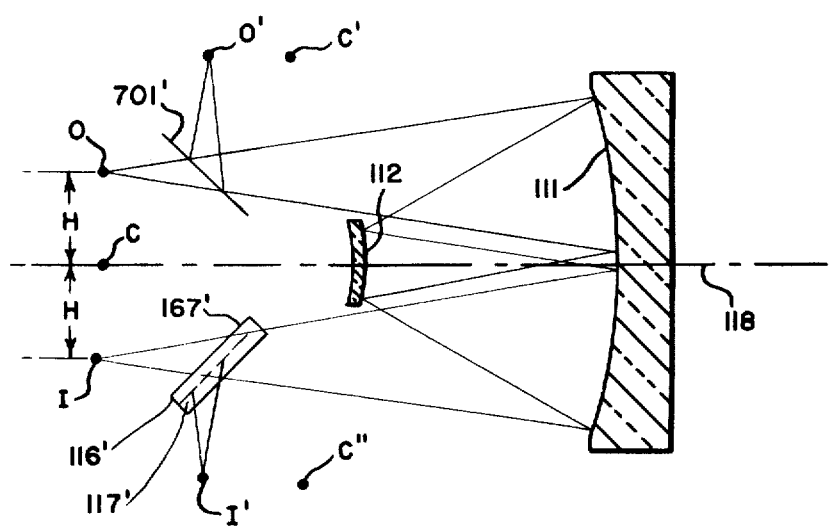

This construction is illustrated in FIGS. 3 and 4. FIG. 3 is a diagrammatic perspective view of mirrors 111 and 112 alone and FIG. 4 is a sectional view of those mirrors in a plane containing their common center of curvature C, with a simplified representation of mirror array 113. In both figures, O is an object point distant from mirror 111 substantially by its radius of curvature R, and I is the image of O as successively formed by mirror 111, by mirror 112 and by mirror 111 a second time. The object and image points O and I lie in a plane passing through the center of curvature C, and the perpendicular to this plane through C is axis 118 of FIGS. 3 and 4. O and I are both distant from C by a distance which may be called H. In FIG. 3, there have been drawn arcuate lines Z of radius H in the plane containing O and I which is perpendicular to the axis 118. In accordance with the disclosure of U.S. Pat. No. 3,748,015, improved imagery is achieved in the combination of mirrors 111 and 112 for object points optically distant from axis 118 by the distance H by giving to the convex reflecting surface of mirror 112 a radius which is approximately $R/2 + H^2/4R$, R being, as before, the radius of curvature of the concave spherical reflecting surface of mirror 111. This relation is desirably incorporated in the sizing of mirrors 111 and 112 in the machine of the invention. In other words, if the mean radius of the arcuate area 223 in FIG. 2 is H, and if the radius of mirror 111 is R, the radius of mirror 112 is $R/2 + H^2/4R$.

In FIG. 4, the plane reflecting mirror formed by the plate 701 of FIG. 2 is schematically indicated at 701', and the combination of the plane reflecting faces 116 and 117 is indicated at 116', 117' with their line of intersection being indicated at 167'. The image of the object point O in mirror 701' is indicated at O', and the image in that mirror of the center of curvature C is indicated at C'. The image of the image point I in the mirror combination 116, 117 is indicated at I', and the image in that combination of the center of curvature C is indicated at C''. The points O' and C' are separated by the distance H, and so are points I' and C''. In the apparatus of Ser. No. 339,860, the illumination system and the image-forming system 110 are so coordinated in their dimensions that the mean radius H of the arc to which the arcuate illuminated area 223 of FIG. 2 conforms matches at least approximately the dimension H according to which the radius of curvature of mirror 112 is oversized in accordance with the relation just set forth. Moreover, the illumination system and the image forming system 110 are positioned with respect to each other so that the center of curvature of the arcuate area 223 coincides at least approximately with the point identified as C' in FIG. 4, this being in the machine the image in mirror 701 of an object point separated by the distance H from axis 118 of system 110. The mask and wafer are caused to lie in planes perpendicular to the plane of FIG. 4 and containing, in the case of the mask, points O' and C' of FIG. 4, and in the case of the wafer, points I' and C'' of FIG. 4.

With the construction of the system 110 and its coordination to the location of the mask and wafer and to the dimensions and location of the arcuate illuminated area 223 which have been described, the apparatus provides at the plane of wafer 262 away from the reader in FIG. 2, a high quality image at unity magnification of an object lying in the face of mask 222 near the reader in FIG. 2. More particularly, such a high quality unity magnification image is provided for an object lying within the extra-axial arcuate area indicated at 223 on that surface of the mask in accordance with the disclosure of U.S. Pat. No. 3,748,015.

The orientation to each other of the object and image achieved in imaging system 110 with the help of the "roof" faces 116 and 117 is indicated in FIG. 2 by the application of the upper case letter F to the near face of mask 220 and to the far face of wafer 262. This is the contact print orientation above referred to. It has the advantage that it is compatible with the arcuate and, therefore, rotational motion which the carriage imposes on the mask and wafer. It has the additional advantage of being compatible with other processes or process steps employing contact printing.

After the mask and wafer have been properly positioned with respect to each other in the carriage, with the aid of the coarse and fine viewing systems described in Ser. No. 339,860, the operator of the machine of FIG. 1 programs the machine for an exposure, with the aid of one of the controls on the panel 750. This shifts carriage 200 to one end of its travel, drawing the mask and wafer respectively out of illuminated area 223 and out of the image of that area produced by the imaging system 110. The carriage then rotates through its travel, exposing successive portions of the mask to illumination over the stationary arc-shaped area 223 and thereby exposing successive portions of the wafer to the image of those successively illuminated portions of the mask.

Thus, the three mirror folding system as embodied in the mirror array 113 permits ease of operation in an apparatus of this type. It permits rotating the mask and wafer together in a carriage 200 pivotally mounted and at the same time, provides a final output equivalent to that which would be obtained through contact printing. Since contact printing is common in this art, i.e., in the micro-circuit art, this gives the system a further advantage.

Thus, a three mirror folding system for use with an optical projection and scanning apparatus which permits scanning a mask and wafer together and obtaining an image on the wafer equivalent to that obtained through contact printing has been disclosed. Although a specific embodiment has been illustrated and described, it will be obvious to those skilled in the art that various modifications may be made without departing from the spirit of the invention which is intended to be limited solely by the appended claims.

What is claimed is:

1. In an apparatus for photographically exposing an image receiving surface to a light image of an object, said apparatus comprising a unit power optical system having an optical axis and having conjugate planes normal to that axis for which the system is of unit power, plane reflecting surfaces interposed in the optical system for repositioning said conjugate planes, separate means to support substantially plane object and image-receiving surfaces in said repositions of the conjugate planes, and means to illuminate in said object surface an arcuate area exterior of and having its center of curvature substantially on said optical axis in relation to said reposition of the object plane, said plane reflecting surfaces comprising a first plane reflecting surface at an angle to said optical axis for repositioning one of said conjugate planes and a 90° roof formed of a pair of plane reflecting surfaces having their line of intersection at a 90° angle relative to the plane of the first plane reflecting surface, and said roof being disposed for locating said other conjugated plane parallel to said one conjugate plane to permit advancing said object and image surfaces in the same direction simultaneously and for said reflecting surfaces to generate at said image surface an image equivalent in orientation to a contact print image.

2. Apparatus as in claim 1 wherein said first plane reflecting surface and said roof are formed in a single monolithic assembly.

3. Apparatus as in claim 1 in which said plane reflecting surfaces reposition said conjugate planes to be substantially parallel to said system optical axis.

4. Apparatus as in claim 1 in which said first plane reflecting surfaces and said roof reposition said conjugate planes outward respectively from opposite sides of said system optical axis.

5. Apparatus as in claim 4 in which said conjugate planes are repositioned to be substantially parallel to said system axis.

* * * * *